(12) United States Patent
Cheng et al.

(10) Patent No.: US 9,373,639 B2
(45) Date of Patent: Jun. 21, 2016

(54) THIN CHANNEL-ON-INSULATOR MOSFET DEVICE WITH N+ EPITAXY SUBSTRATE AND EMBEDDED STRESSOR

(71) Applicant: INTERNATIONAL BUSINESS MACHINES CORPORATION, Armonk, NY (US)

(72) Inventors: Kangguo Cheng, Schenectady, NY (US); Bruce B. Doris, Brewster, NY (US); Ali Khakifirooz, Mountain View, CA (US); Alexander Reznicek, Troy, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/697,082

(22) Filed: Apr. 27, 2015

(65) Prior Publication Data

US 2015/0270395 A1    Sep. 24, 2015

Related U.S. Application Data

(62) Division of application No. 14/221,490, filed on Mar. 21, 2014, now Pat. No. 9,184,179.

(51) Int. Cl.
*H01L 29/00* (2006.01)
*H01L 27/12* (2006.01)
(Continued)

(52) U.S. Cl.
CPC ...... *H01L 27/1203* (2013.01); *H01L 21/02532* (2013.01); *H01L 21/823814* (2013.01);
(Continued)

(58) Field of Classification Search
CPC ............... H01L 29/808; H01L 29/812; H01L 29/66848; H01L 27/0922; H01L 27/108
USPC ........................................................ 257/351
See application file for complete search history.

(56) References Cited

U.S. PATENT DOCUMENTS

| 6,239,463 B1 | 5/2001 | Williams et al. |
| 6,274,913 B1 | 8/2001 | Brigham et al. |

(Continued)

OTHER PUBLICATIONS

Ang, Kah-Wee et al., "Beneath-the-channel strain-transfer-structure (STS) and embedded source/drain stressors for strain and performance enhancement of nanoscale MOSFETs," 2007 IEEE Symposium on VLSI Technology, 2007, pp. 42-43.

(Continued)

*Primary Examiner* — Tran Tran
(74) *Attorney, Agent, or Firm* — Cantor Colburn LLP; Vazken Alexanian

(57) ABSTRACT

A method of forming a field effect transistor (FET) device includes forming a recess in a PFET region of a starting semiconductor substrate comprising a bulk semiconductor layer an epitaxial n+ layer formed on the bulk semiconductor layer, a buried insulator (BOX) layer formed on the epitaxial n+ layer, and an active semiconductor or silicon-on-insulator (SOI) layer formed on the BOX layer, the recess being formed completely through the SOI layer, the BOX layer, and partially into the epitaxial n+ layer; epitaxially growing a silicon germanium (SiGe) transition layer on the epitaxial n+ layer, the SiGe transition layer having a lower dopant concentration than the epitaxial n+ layer; and epitaxially growing embedded source/drain (S/D) regions on the SiGe transition layer and adjacent the SOI layer in the PFET region, the embedded S/D regions comprising p-type doped SiGe.

9 Claims, 7 Drawing Sheets

(51) Int. Cl.
*H01L 21/84* (2006.01)
*H01L 29/08* (2006.01)
*H01L 29/06* (2006.01)
*H01L 29/161* (2006.01)
*H01L 29/78* (2006.01)
*H01L 21/02* (2006.01)
*H01L 21/8238* (2006.01)
*H01L 27/092* (2006.01)
*H01L 27/108* (2006.01)

(52) U.S. Cl.
CPC ............ *H01L21/84* (2013.01); *H01L 27/092* (2013.01); *H01L 27/0922* (2013.01); *H01L 27/108* (2013.01); *H01L 29/0649* (2013.01); *H01L 29/0847* (2013.01); *H01L 29/161* (2013.01); *H01L 29/7848* (2013.01)

(56) References Cited

U.S. PATENT DOCUMENTS

| | | |
|---|---|---|
| 7,704,833 B2 | 4/2010 | Lindert et al. |
| 7,718,500 B2 | 5/2010 | Chong et al. |
| 8,324,043 B2 | 12/2012 | Kim et al. |
| 8,338,259 B2 | 12/2012 | Wu et al. |
| 8,378,432 B2 | 2/2013 | Carter et al. |
| 2012/0171832 A1 | 7/2012 | Toh et al. |
| 2012/0261672 A1 | 10/2012 | Chidambarrao et al. |
| 2013/0161706 A1* | 6/2013 | Ning et al. ............ 257/280 |
| 2013/0178043 A1* | 7/2013 | Cheng et al. ............ 438/400 |

OTHER PUBLICATIONS

B. Greene et al., "High performance 32nm SOI CMOS with high-k/metal gate and 0.149 µm 2 SRAM and ultra low-k back end with eleven levels of copper," 2009 Symposium on VLSI Technology, 2009, pp. 140-141.

* cited by examiner

THIN CHANNEL-ON-INSULATOR MOSFET DEVICE WITH N+ EPITAXY SUBSTRATE AND EMBEDDED STRESSOR

DOMESTIC PRIORITY

This application is a divisional of U.S. patent application Ser. No. 14/221,490, filed Mar. 21, 2014, the disclosure of which is incorporated by reference herein in its entirety.

BACKGROUND

The present invention relates generally to semiconductor device manufacturing techniques and, more particularly, to a thin channel-on-insulator metal oxide semiconductor field effect transistor (MOSFET) device having an n+ epitaxy substrate with an embedded stressor.

In the manufacture of integrated circuit devices it is desirable to reduce the dimensions of the transistors used to form the individual circuits. In the case of field effect transistors (FETs), reducing the channel length provides the capability to deliver a given amount of drive current with a smaller channel width. By reducing the width and length of a FET, the parasitic gate capacitance (which is a function of the area defined by the width and length) can be reduced, thereby improving circuit performance. Similarly, reducing the size of transistors is beneficial in that less area is consumed for a given circuit, and this allows more circuits in a given area, or a smaller, less costly chip, or both.

To further enhance transistor performance, MOSFET devices have been fabricated using strained channel regions located in portions of a semiconductor substrate. Strained channel regions allow enhanced carrier mobility to be realized, thereby resulting in increased performance when used for n-channel (NFET) or for p-channel (PFET) devices. Generally, it is desirable to induce a tensile strain in the n-channel of an NFET in the source-to-drain direction to increase electron mobility and to induce a compressive strain in the p-channel of a PFET in the source-to-drain direction to increase hole mobility. Currently, there are several existing approaches of introducing strain in the transistor channel region.

In one approach, strain in the channel is introduced by creating a recess in the substrate in the source/drain regions. For example, a PFET device having a compressive stress in the channel region may be formed on a silicon substrate by epitaxially growing a stress-inducing layer having a larger lattice structure than the silicon, such as a layer of SiGe, within recessed regions in the source/drain regions. Similarly, an NFET device having a tensile stress in the channel region may be formed on a silicon substrate by epitaxially growing a stress-inducing layer having a smaller lattice structure than the silicon, such as a layer of SiC, within recessed regions in the source/drain regions.

SUMMARY

In an exemplary embodiment, a method of forming a field effect transistor (FET) device includes forming a recess in a PFET region of a starting semiconductor substrate comprising a bulk semiconductor layer an epitaxial n+ layer formed on the bulk semiconductor layer, a buried insulator (BOX) layer formed on the epitaxial n+ layer, and an active semiconductor or silicon-on-insulator (SOI) layer formed on the BOX layer, the recess being formed completely through the SOI layer, the BOX layer, and partially into the epitaxial n+ layer; epitaxially growing a silicon germanium (SiGe) transition layer on the epitaxial n+ layer, the SiGe transition layer having a lower dopant concentration than the epitaxial n+ layer; and epitaxially growing embedded source/drain (S/D) regions on the SiGe transition layer and adjacent the SOI layer in the PFET region, the embedded S/D regions comprising p-type doped SiGe.

In another embodiment, a method of forming a field effect transistor (FET) device includes defining an PFET region and an NFET region of a starting semiconductor substrate comprising a bulk semiconductor layer an epitaxial n+ layer formed on the bulk semiconductor layer, a buried insulator (BOX) layer formed on the epitaxial n+ layer, and an active semiconductor or silicon-on-insulator (SOI) layer formed on the BOX layer; forming gate stack structures on the SOI layer in the NFET and PFET regions; forming a recess in the PFET region, the recess being formed completely through the SOI layer, the BOX layer, and partially into the epitaxial n+ layer; epitaxially growing a silicon germanium (SiGe) transition layer on the epitaxial n+ layer, the SiGe transition layer having a lower dopant concentration than the epitaxial n+ layer; epitaxially growing embedded source/drain (S/D) regions on the SiGe transition layer and adjacent the SOI layer in the PFET region, the embedded S/D regions comprising p-type doped SiGe; and forming raised S/D regions on portions of the SOI layer in an NFET region of the starting semiconductor substrate.

In another embodiment, a field effect transistor (FET) device includes a semiconductor substrate comprising a bulk semiconductor layer an epitaxial n+ layer formed on the bulk semiconductor layer, a buried insulator (BOX) layer formed on the epitaxial n+ layer, and an active semiconductor or silicon-on-insulator (SOI) layer formed on the BOX layer; an epitaxial silicon germanium (SiGe) transition layer grown on the epitaxial n+ layer in a PFET region of the semiconductor substrate, the SiGe transition layer having a lower dopant concentration than the epitaxial n+ layer; and embedded source/drain (S/D) regions epitaxially grown on the SiGe transition layer and adjacent the SOI layer in the PFET region, the embedded S/D regions comprising p-type doped SiGe.

BRIEF DESCRIPTION OF THE SEVERAL VIEWS OF THE DRAWINGS

Referring to the exemplary drawings wherein like elements are numbered alike in the several Figures:

FIGS. 1 through 7 are a series of cross sectional views illustrating a method of forming a thin channel-on-insulator MOSFET device having an n+ epitaxy substrate with an embedded stressor, in which:

FIG. 1 illustrates a starting substrate including a bulk layer, an n+ epitaxial layer, a BOX layer and an active layer;

FIG. 2 illustrates the formation of exemplary NFET and PFET active regions in the active layer of FIG. 1;

FIG. 3 illustrates the formation of patterned transistor gate structures over the NFET and PFET regions of FIG. 2;

FIG. 4 illustrates recessing portions of the PFET active region, through the BOX layer and into the n+ epitaxial layer;

FIG. 5 illustrates the formation of epitaxially grown, lightly doped n-type SiGe regions on exposed portions of the n+ epitaxial layer;

FIG. 6 illustrates the formation of epitaxially grown, doped p+ SiGe regions on exposed portions of the n-type SiGe regions; and FIG. 7 illustrates the formation of raised source/drain regions on the NFET active region.

DETAILED DESCRIPTION

With respect to the channel strain engineering techniques discussed above, for a thin channel MOSFET such as an extremely thin silicon-on-insulator ETSOI substrate or a FinFET where the channel is separated from the substrate with an insulator, it is desirable to form a recess into the dielectric that separates the active layer from the bulk substrate and thereafter grow embedded S/D regions by forming epitaxy using the substrate as the starting plane. In the case of embedded dynamic random access memory (eDRAM) devices, it is desirable to use substrates with n+ epitaxy layer directly beneath the buried oxide (insulator) (BOX) layer. However, forming embedded S/D regions directly on an n+ substrate is not previously known.

Accordingly, disclosed herein is a method of forming embedded S/D regions on n+ substrates for PFET devices. In order to avoid extra junction leakage due to the relatively high doping level of the n+ substrate (e.g., $1 \times 10^{19}$ atoms/cm$^3$ or higher) and the relatively high doping level of the p+ embedded S/D regions (e.g., $1 \times 10^{20}$ atoms/cm$^3$ or higher), a lesser doped n-type layer is initially formed between the n+ substrate and the p+ S/D regions.

Referring generally now to FIGS. 1 through 7, there are shown a series of cross sectional views illustrating a thin channel-on-insulator MOSFET device having an n+ epitaxy substrate with an embedded stressor, in accordance with an exemplary embodiment.

Figure 1:
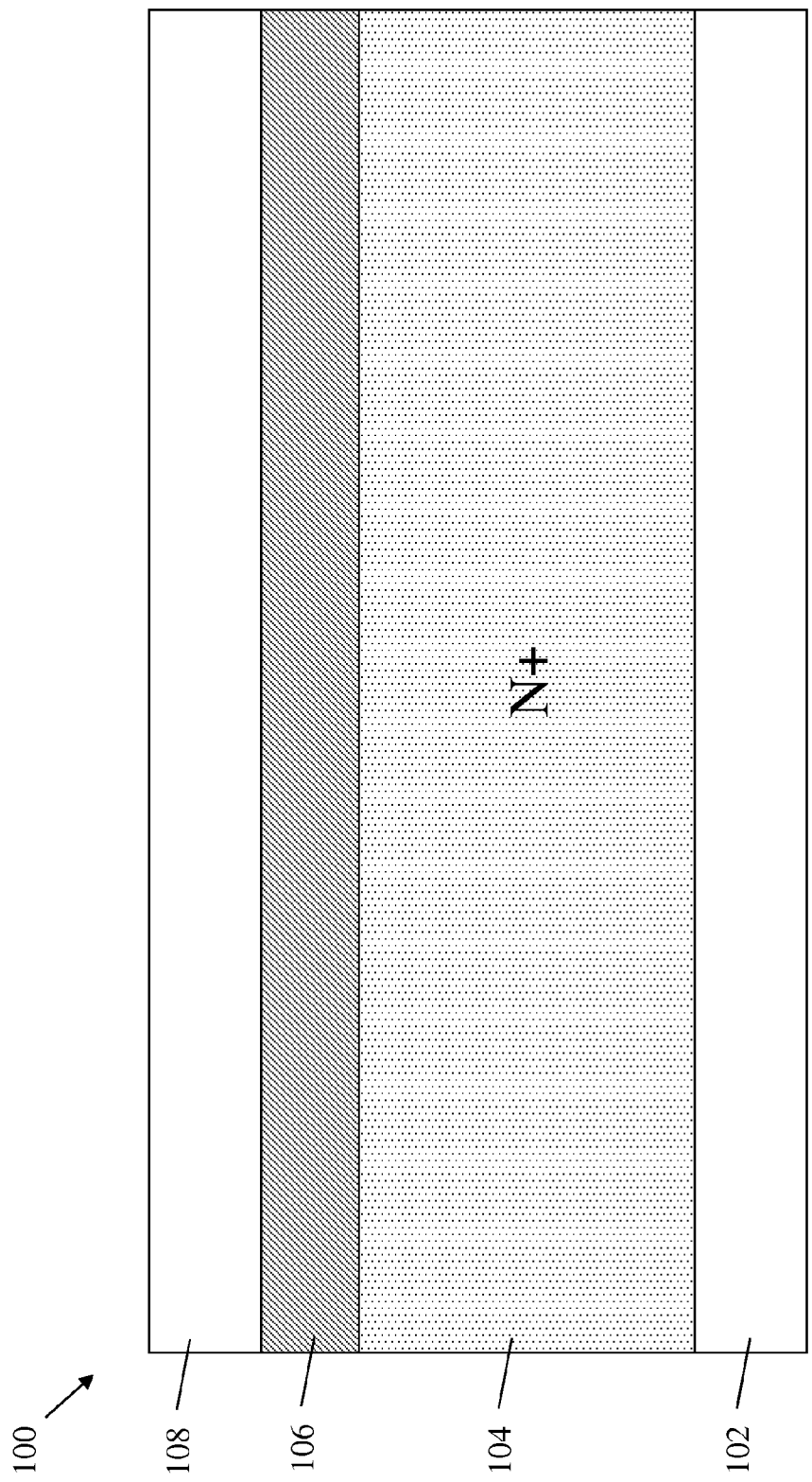

As shown in FIG. 1, a starting semiconductor substrate 100 includes a bulk semiconductor layer or handle portion 102 having an epitaxially grown, n+ layer 104 formed thereon. As indicated above, the epitaxial n+ layer 104 may be of particular used in fast, high density eDRAM device applications, and may be formed to an exemplary thickness of about 7 to about 10 microns (µm). As also indicated above, the epitaxial n+ layer 104 may have an n-type dopant concentration on the order of about $1 \times 10^{19}$ atoms/cm$^3$ or higher. A buried insulator (e.g., oxide) (BOX) layer 106 is formed on the epitaxial n+ layer 104, to an exemplary thickness of about 10 to about 100 nanometers (nm), and an active semiconductor or silicon-on-insulator (SOI) layer 108 is formed on the BOX layer 104. The active SOI layer 108 may be formed to an exemplary thickness of about 4 to about 10 nm, and includes a semiconductor material from which FET device channels are to be defined.

Figure 2:
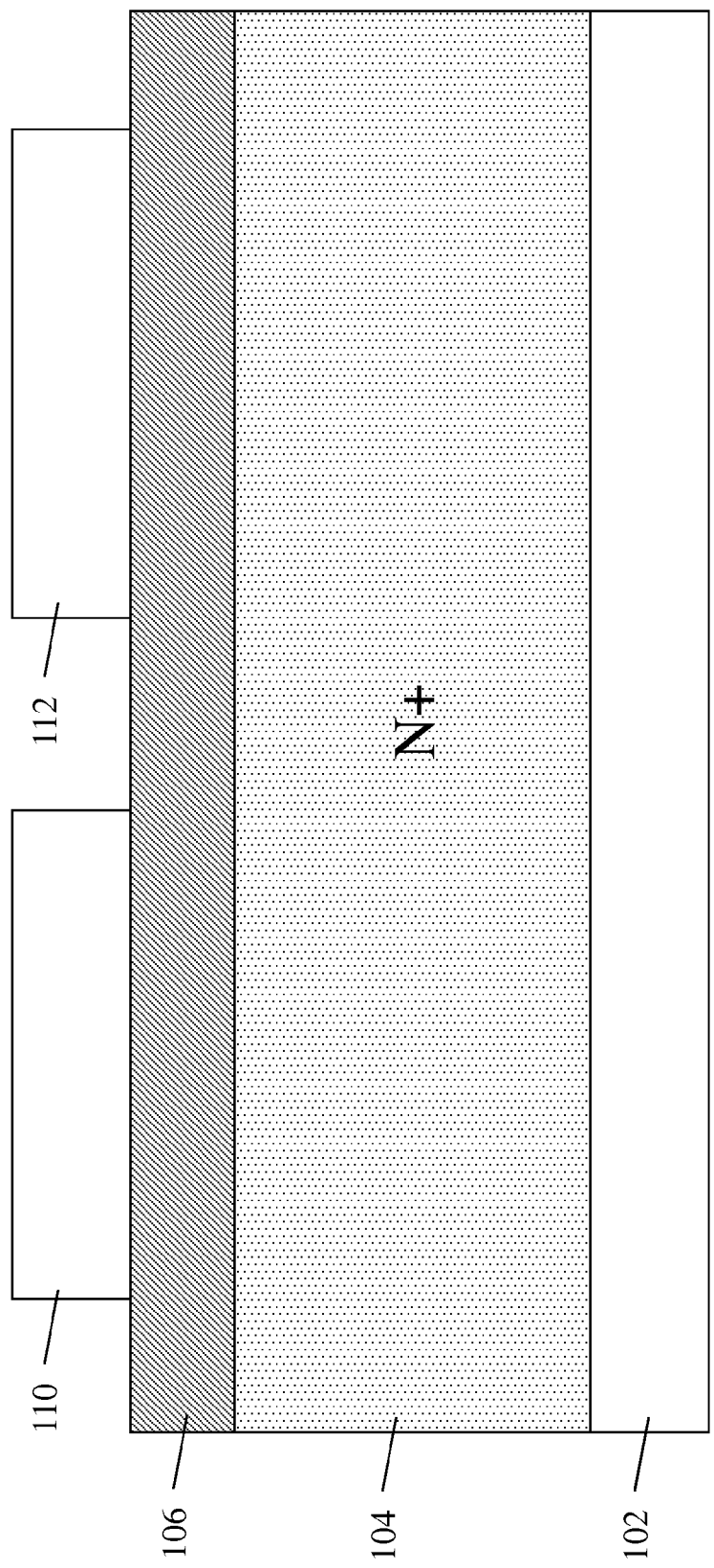
Figure 3:
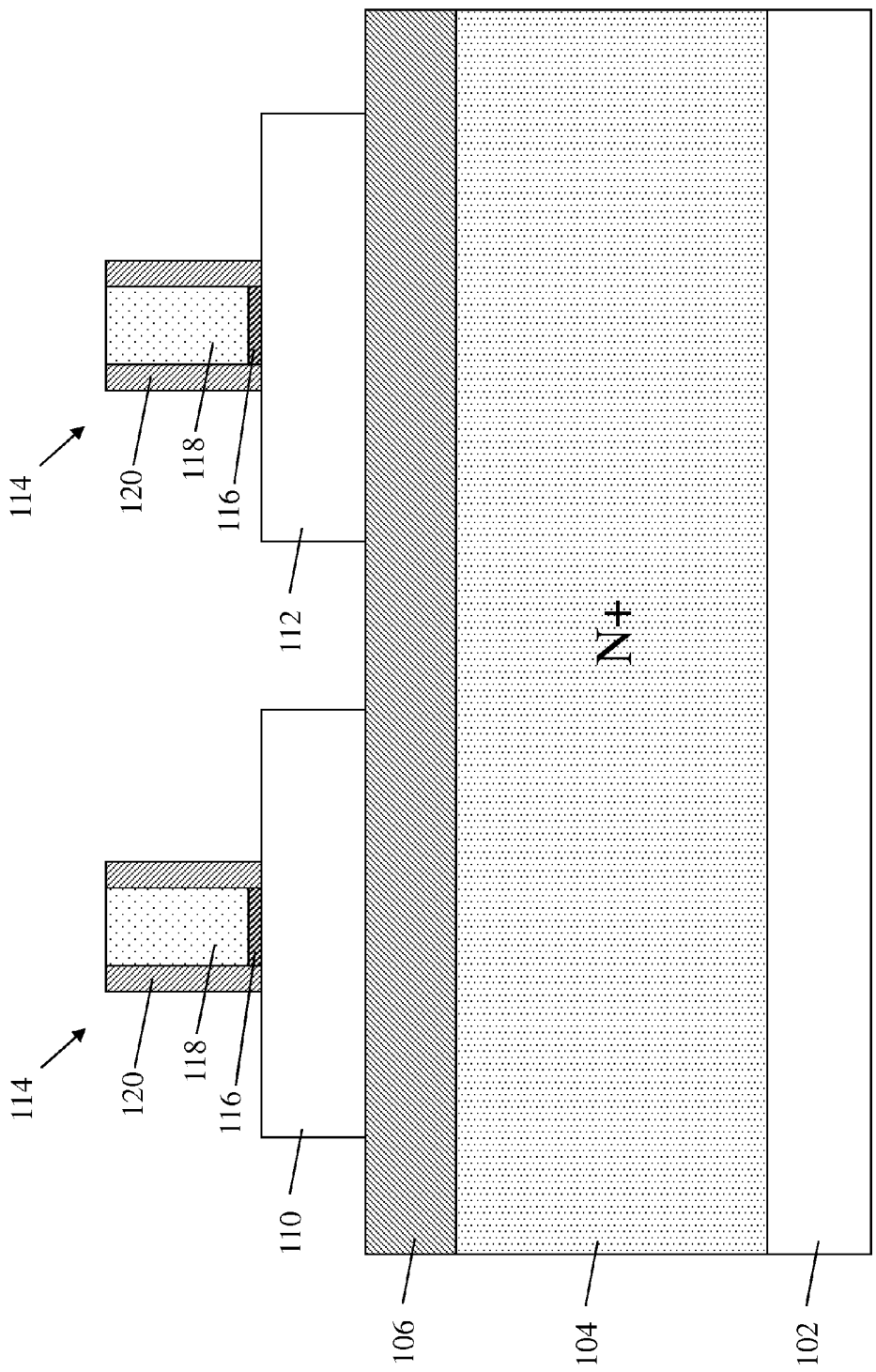

The active SOI layer 108 is patterned so as to define active NFET and PFET regions 110, 112, respectively, as shown in FIG. 2. In the example illustrated, the active NFET region 110 and active PFET region 112 are formed by mesa isolation. However, it should be appreciated that other forms of active device isolation may be employed such as shallow trench isolation (STI) formation, for example. Then, as shown in FIG. 3, gate structures 114 are formed on the active NFET and PFET regions 110, 112. The gate structures 114 may include, for example, one or more gate insulating layers 116 (e.g., oxide, oxynitride, high-k material, etc.), one or more gate conductor layers 118 (e.g., polysilicon, metal, metal nitride, etc.), and one or more sets of sidewall spacers 120 (e.g., nitride). It will be appreciated that the figures are not depicted to scale and that multiple such gate structures 114 may be formed on the active NFET and PFET regions 110, 112. Although not specifically depicted in FIG. 3, halo and extension regions may optionally be formed as known in the art (such as by ion implantation, for example) adjacent to and/or beneath the gate structures 114.

Figure 4:
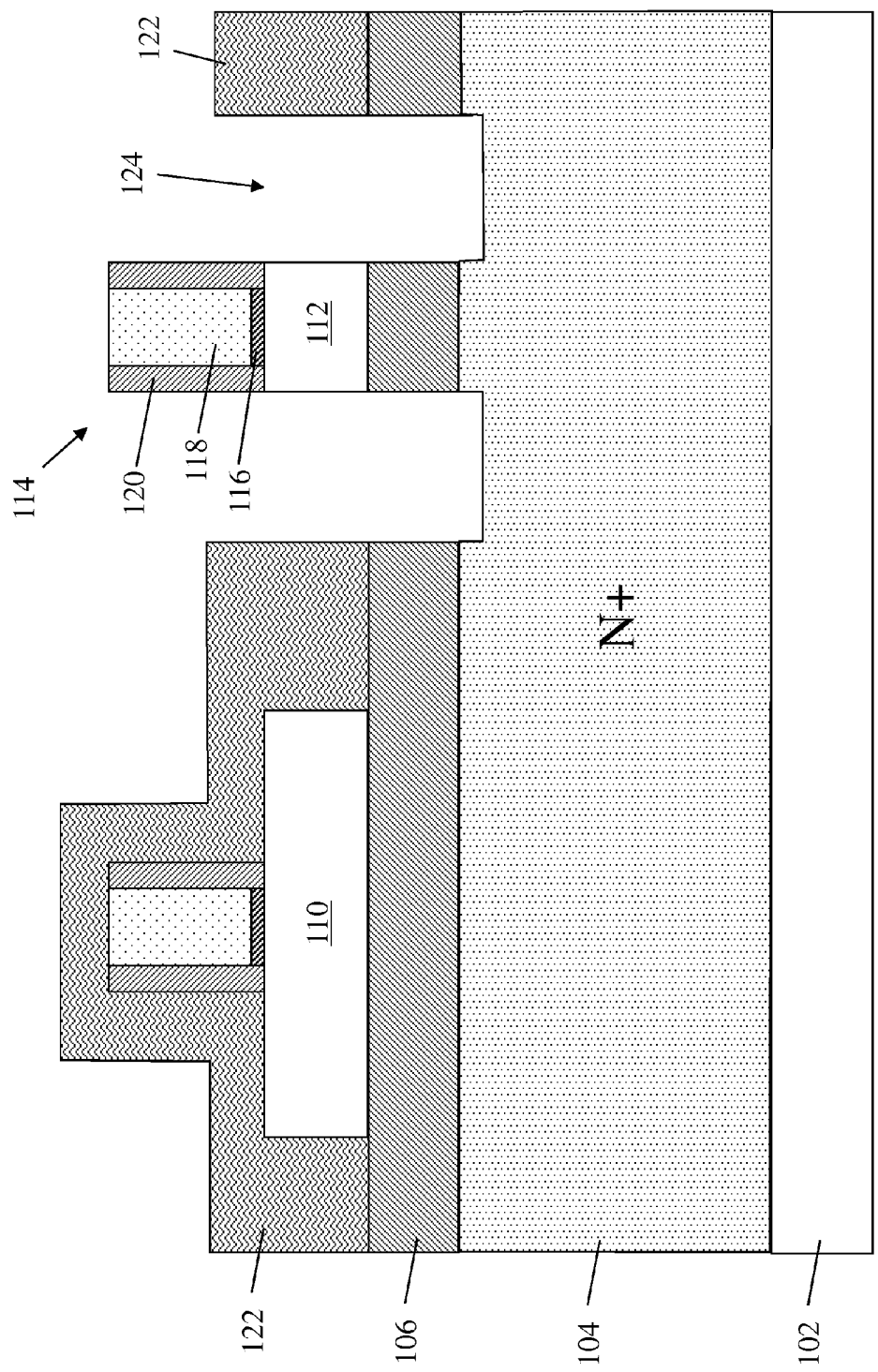

Referring now to FIG. 4, a mask layer 122 is formed over the device to protect the active NFET region 110 and is lithographically patterned so as to expose the active PFET region 112. The mask layer 122 may include one or more of a photoresist layer and a hardmask layer, for example. Recesses 124 are then formed (such as by etching) through the exposed portions of the active PFET region 112, corresponding to PFET source and drain (S/D) locations. The recesses 124 further extend completely through the BOX layer 106 and into the epitaxial n+ layer 104, and may have a total depth from about 25 to about 75 nm.

Figure 5:
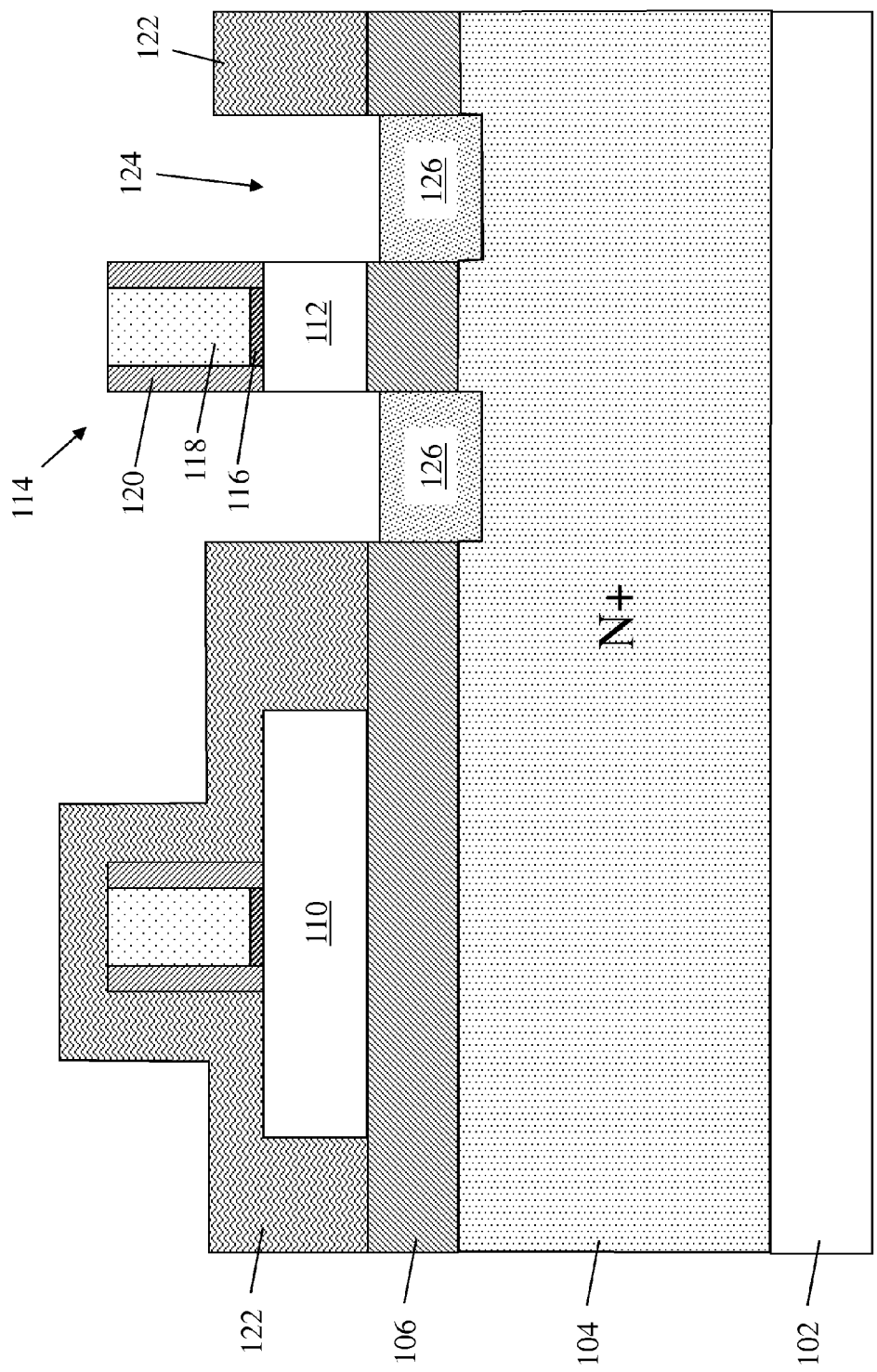

As then shown in FIG. 5, an n-type SiGe transition layer 126 is epitaxially grown on the epitaxial n+ layer 104. The n-type SiGe transition layer 126 is formed so as to have a lower dopant concentration than that of the epitaxial n+ layer 104. In an exemplary embodiment, the concentration of the n-type dopant of the transition layer 126 may be on the order of about $1 \times 10^{18}$ to about $3 \times 10^{18}$ atoms/cm$^3$, roughly an order of magnitude lower than that of the epitaxial n+ layer 104. The doping for the n-type SiGe transition layer 126 may be accomplished by ion implantation or, alternatively, by in situ doping, and the thickness of the n-type SiGe transition layer 126 may be on the order of about 10 to about 50 nm. More specifically, the thickness of the n-type SiGe transition layer 126 may be on the order of about 20 to about 40 nm.

Figure 6:
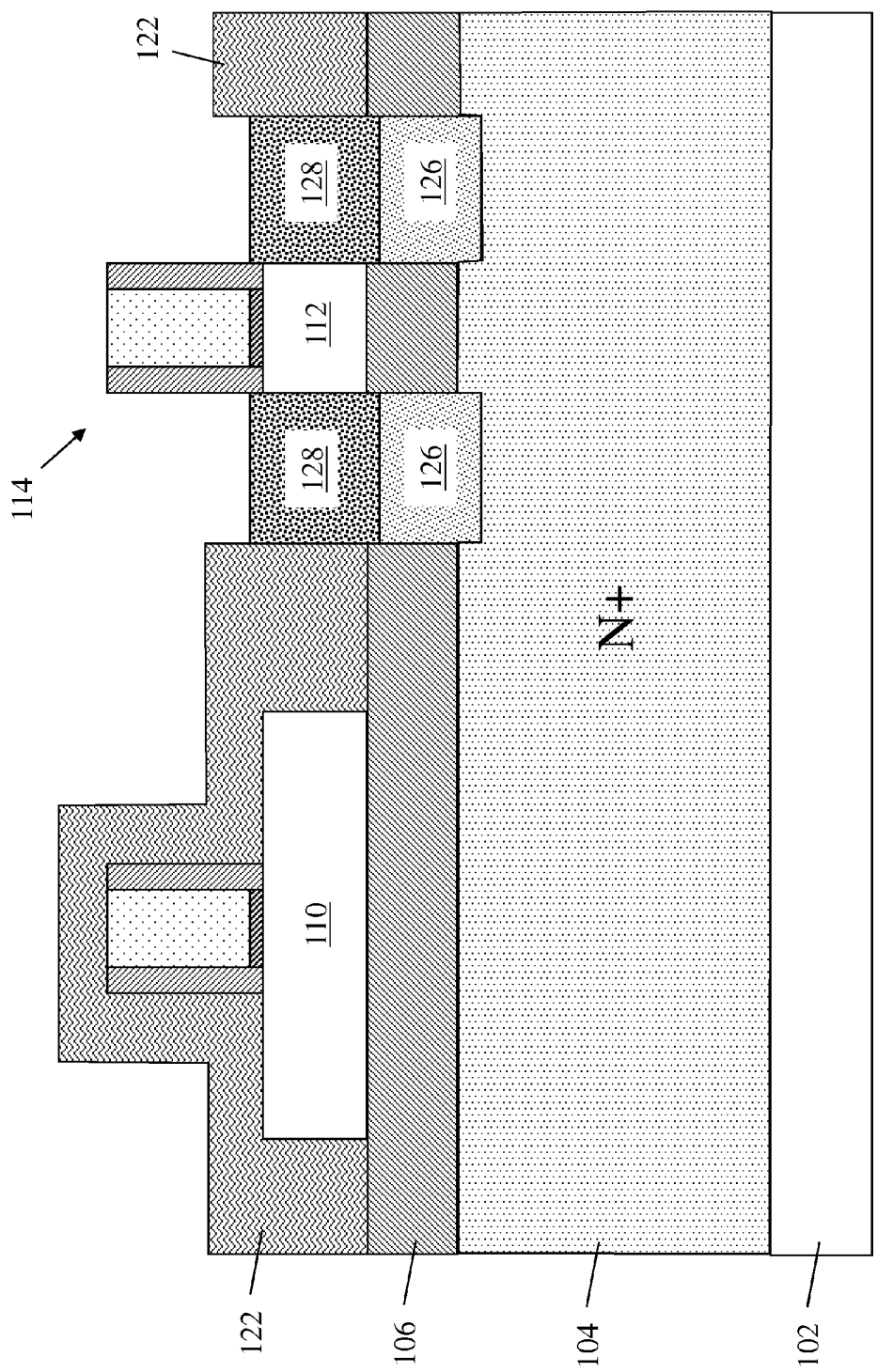

Proceeding to FIG. 6, a p++ SiGe layer 128 is epitaxially grown on the n-type SiGe transition layer 126. The p++ SiGe layer 128 serves as embedded S/D regions for a PFET device, and provides a compressive stress on a channel region defined in the active PFET region 112. An exemplary thickness of the p++ SiGe layer 128 is on the order of about 30 to about 80 nm, and has a p-type dopant concentration on the order of about $1 \times 10^{20}$ atoms/cm$^3$ or higher. Previously, such embedded S/D regions have not been grown for PFET devices used in eDRAM devices having an n+ layer below the BOX layer. The presence of the lightly doped n-type SiGe transition layer 126 provides a gradual transition from the more heavily doped n+ layer 104 to the heavily doped p++ SiGe layer 128, which otherwise might result in excessive junction leakage current through a heavily doped p-n junction.

Figure 7:
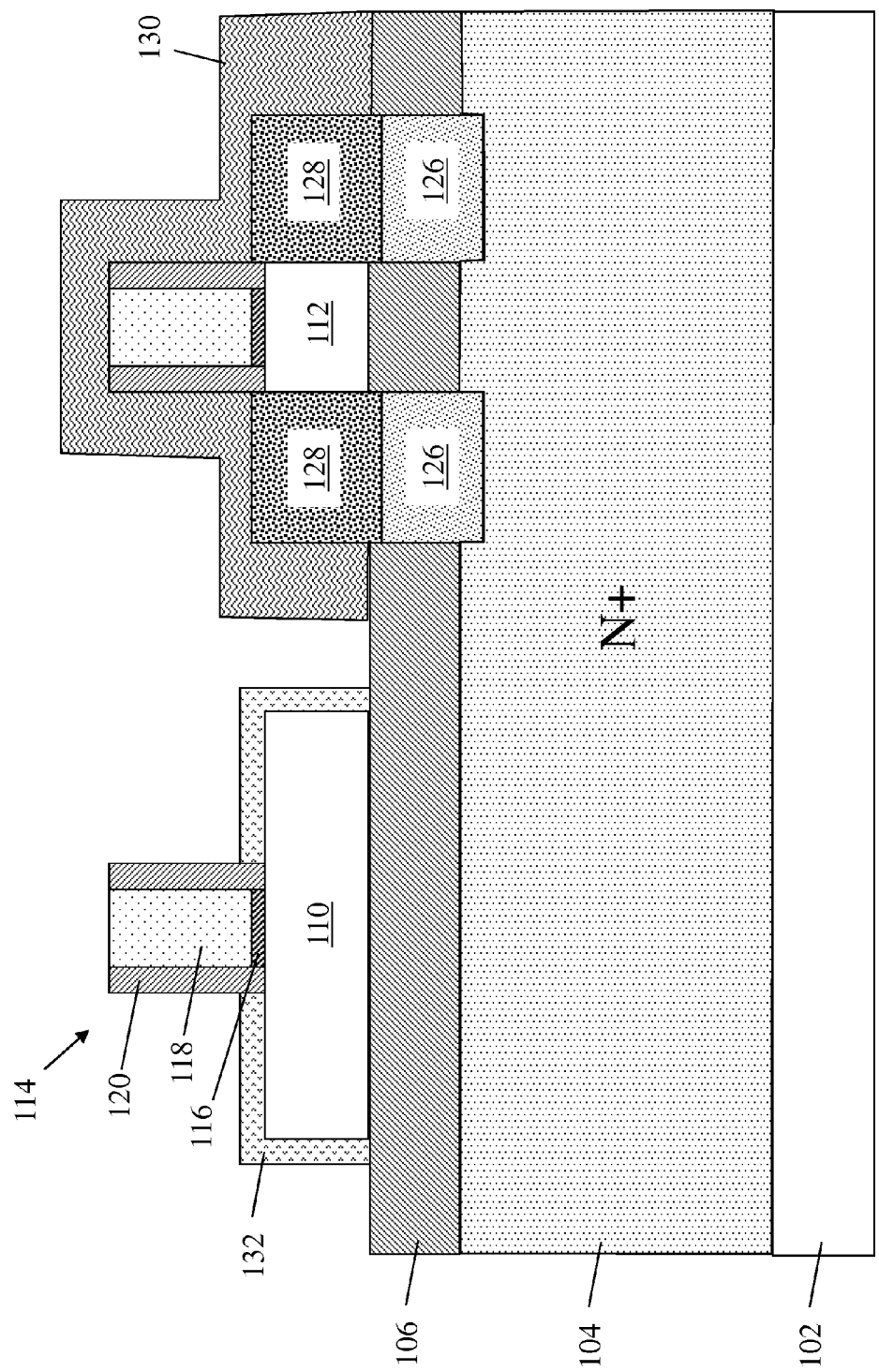

Following processing of the PFET region 112, FIG. 7 illustrates processing for the NFET region 110. Another mask layer 130 is formed over the device and patterned in a manner so as to protect the PFET region 112 and expose the NFET region 110 for further processing. In the embodiment depicted, raised S/D regions 132 are epitaxially grown on the semiconductor surfaces of the NFET region 110. The raised S/D regions 132 may be n++ doped regions of epitaxially grown silicon (Si) for example, or alternatively, silicon carbon (Si:C), and have a p-type dopant concentration on the order of about $1 \times 10^{20}$ atoms/cm$^3$ or higher.

Although the illustrated process flow is depicted as having first processed the PFET region 112 to form the embedded S/D regions, followed by processing the NFET region 110 to form the raised S/D regions, it should be appreciated that a different order of processing operations is also contemplated. That is, for example, the epitaxial growth of the raised S/D regions 132 on the semiconductor surfaces of the NFET region 110 as shown in FIG. 7 could be performed prior to etching the PFET region 112 and growing the lightly doped n-type SiGe transition layer 126 and heavily doped p++ SiGe layer 128 as shown in FIGS. 4-6.

While the invention has been described with reference to an exemplary embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

The invention claimed is:

1. A field effect transistor (FET) device, comprising:
a semiconductor substrate comprising a bulk semiconductor layer, an epitaxial n+ layer formed on and in direct contact with the bulk semiconductor layer, a buried insulator (BOX) layer formed on the epitaxial n+ layer, and an active semiconductor or silicon-on-insulator (SOI) layer formed on the BOX layer;
an epitaxial silicon germanium (SiGe) transition layer arranged in direct contact with the BOX layer and in direct contact with the epitaxial n+ layer in a PFET region of the semiconductor substrate, the SiGe transition layer having a lower dopant concentration than the epitaxial n+ layer; and
embedded source/drain (S/D) regions epitaxially grown on the SiGe transition layer and adjacent the SOI layer in the PFET region, the embedded S/D regions comprising p-type doped SiGe.

2. The device of claim 1, wherein the SiGe transition layer is doped at a concentration of about $1 \times 10^{18}$ atoms/cm$^3$ or higher.

3. The device of claim 1, wherein the n+ epitaxial layer is doped at a concentration of about $1 \times 10^{19}$ atoms/cm$^3$ or higher.

4. The device of claim 1, wherein the embedded S/D regions are doped at a concentration of about $1 \times 10^{20}$ atoms/cm$^3$ or higher.

5. The device of claim 1, further comprising a gate stack structure on the SOI layer in the PFET region.

6. The device of claim 1, wherein the epitaxial n+ layer has a thickness of about 7 to about 10 microns (μm).

7. The device of claim 1, wherein the SiGe transition layer has a thickness of about 10 to about 50 nanometers (nm).

8. The device of claim 1, wherein the embedded S/D regions have a thickness of about 30 to about 80 nm.

9. The device of claim 1, further comprising raised S/D regions grown on portions of the SOI layer in an NFET region of the semiconductor substrate.

* * * * *